United States Patent
Kononchuk et al.

(10) Patent No.: US 10,250,282 B2
(45) Date of Patent: Apr. 2, 2019

(54) STRUCTURE FOR RADIOFREQUENCY APPLICATIONS

(71) Applicant: Soitec, Bernin (FR)

(72) Inventors: Oleg Kononchuk, Grenoble (FR); Didier Landru, Le Champ-près-Froges (FR); Christophe Figuet, Crolles (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 15/531,976

(22) PCT Filed: Sep. 17, 2015

(86) PCT No.: PCT/FR2015/052494
§ 371 (c)(1),
(2) Date: May 31, 2017

(87) PCT Pub. No.: WO2016/087728
PCT Pub. Date: Jun. 9, 2016

(65) Prior Publication Data
US 2017/0331501 A1    Nov. 16, 2017

(30) Foreign Application Priority Data

Dec. 4, 2014 (FR) .................................... 14 02801

(51) Int. Cl.
| | |
|---|---|
| *H04B 1/38* | (2015.01) |
| *H04B 1/03* | (2006.01) |
| *H01L 21/02* | (2006.01) |
| *H01L 21/762* | (2006.01) |
| *H01M 4/66* | (2006.01) |
| *H01L 21/28* | (2006.01) |
| *H01L 41/047* | (2006.01) |

(52) U.S. Cl.
CPC ........... *H04B 1/03* (2013.01); *H01L 21/0262* (2013.01); *H01L 21/02378* (2013.01);
(Continued)

(58) Field of Classification Search
CPC ......... H01L 21/76251; H01L 21/76254; H01L 21/76898; H01L 21/02532;
(Continued)

(56) References Cited

U.S. PATENT DOCUMENTS

| | | | | |
|---|---|---|---|---|
| 5,637,883 A | * | 6/1997 | Bowman | ................ B82Y 20/00 257/184 |
| 2007/0120447 A1 | * | 5/2007 | Umemiya | ........... H01L 41/0533 310/366 |

(Continued)

OTHER PUBLICATIONS

International Search Report for International Application No. PCT/FR2015/052494 dated Jan. 29, 2016, 3 pages.
(Continued)

*Primary Examiner* — Nhan T Le
(74) *Attorney, Agent, or Firm* — TraskBritt

(57) ABSTRACT

A structure for radiofrequency applications includes: a semiconducting supporting substrate, and a trapping layer arranged on the supporting substrate. The trapping layer includes a higher defect density than a predetermined defect density. The predetermined defect density is the defect density beyond which the electric resistivity of the trapping layer is no lower than 10,000 ohm·cm over a temperature range extending from −20° C. to 120° C.

19 Claims, 2 Drawing Sheets

(52) U.S. Cl.
CPC .. *H01L 21/02381* (2013.01); *H01L 21/02529* (2013.01); *H01L 21/02532* (2013.01); *H01L 21/76254* (2013.01); *H01M 4/663* (2013.01); *H01L 21/02167* (2013.01); *H01L 21/28282* (2013.01); *H01L 21/76297* (2013.01); *H01L 41/0477* (2013.01)

(58) Field of Classification Search
CPC ........... H01L 21/02595; H01L 21/2007; H01L 21/02381; H01L 21/0262; H01L 21/763; H01L 21/02378; H04B 1/03
See application file for complete search history.

(56) References Cited

U.S. PATENT DOCUMENTS

| | | | |
|---|---|---|---|
| 2010/0314722 A1 | 12/2010 | Ishizuka et al. | |
| 2013/0084689 A1* | 4/2013 | Arriagada | H01L 21/02365 438/478 |
| 2014/0070267 A1* | 3/2014 | Kim | H01L 29/66333 257/139 |

OTHER PUBLICATIONS

International Written Opinion for International Application No. PCT/FR2015/052494 dated Jan. 29, 2016, 8 pages.

Kononchuk et al., Silicon-on-insulator (SOI) Technology, manufacture and applications, Woodhead Publishing, Jun. 5, 2014, points 10.7 and 10.8. (Abstract only).

Lederer et al., Fabrication and Characterization of High Resistivity SOI Wafers for RF Applications, ECS Transactions, vol. 16, Jan. 1, 2008, pp. 165-174. (Abstract only).

Lederer et al., RF Performance of a Commercial SOI Technology Transferred Onto a Passivated HR Silicon Substrate, IEEE Transactions on Electron Devices, vol. 55, No. 7, Jul. 1, 2008, pp. 1664-1671. (Abstract only).

Mott, N. F., Conduction in Non-Crystalline Materials, Philosophical Magazine, vol. 19, No. 160, (1969), pp. 835-852.

* cited by examiner

STRUCTURE FOR RADIOFREQUENCY APPLICATIONS

CROSS-REFERENCE TO RELATED APPLICATIONS

This application is a national phase entry under 35 U.S.C. § 371 of International Patent Application PCT/FR2015/052494, filed Sep. 17, 2015, designating the United States of America and published as International Patent Publication WO 2016/087728 A1 on Jun. 9, 2016, which claims the benefit under Article 8 of the Patent Cooperation Treaty to French Patent Application Serial No. 1402801, filed Dec. 4, 2014.

TECHNICAL FIELD

This disclosure relates to the field of integrated radiofrequency devices

BACKGROUND

Integrated devices are usually produced on substrates in the form of wafers, which mainly serve as a medium for their manufacture. However, the rise in the level of integration and in the performances expected of these devices results in an ever-increasing linkage between their performances and the characteristics of the substrate on which they are formed. This is particularly the case of radiofrequency (RF) devices processing signals with a frequency of between approximately 3 kHz and 300 GHz, which are more particularly applied in the telecommunications field (cellular telephony, Wi-Fi, BLUETOOTH®, etc.).

By way of an example of device/substrate coupling, the electromagnetic fields, originating from the high-frequency signals propagating through the devices, penetrate deeply into the substrate where they interact with any charge carriers located there. This results in problems of non-linear distortion of the signal (harmonics), unnecessary consumption of a portion of the energy of the signal by insertion loss and possible influences among components.

Hence, RF devices display characteristics governed both by their architectures and production processes and by the ability of the substrate on which they are manufactured to limit insertion losses, diaphonies between neighboring devices and phenomena of non-linear distortion-generating harmonics.

With the explosion of the demand for data, created by "multimedia" applications, changes in mobile telephony standards (2G, 3G, LTE, LTE-A, etc.) likewise impose increasingly stringent specifications on RF components. The RF performances of these components typically need to be guaranteed between −20° C. and +120° C., implying that the electrical properties of the substrate are stable within this temperature range.

Radiofrequency devices, such as switches and antenna adapters in addition to power amplifiers, can be produced on different types of substrate.

Silicon-on-sapphire substrates, commonly referred to as SOS, are known in which the components, produced using microelectronic technologies in the superficial layer of silicon, benefit from the insulating properties of the sapphire substrate, which are temperature-independent. For example, antenna switches and power amplifiers manufactured on this type of substrate display very good merit factors, but are mainly used for niche applications owing to the overall cost of the solution.

Substrates based on high-resistivity silicon are also known, comprising a supporting substrate, a trapping layer arranged in the supporting substrate, a dielectric layer arranged on the trapping layer and a semiconducting layer arranged on the dielectric layer. The supporting substrate usually has a resistivity greater than 1,000 ohm·cm. The trapping layer may comprise undoped polycrystalline silicon. The combination of a high-resistivity supporting substrate and a trapping layer according to the state of the art makes it possible to reduce the device/substrate coupling mentioned above, thereby ensuring good performances of the RF devices. In this respect, the persons skilled in the art will find a review of the performances of RF devices manufactured on the high-resistivity semiconducting substrate known in the prior art in "Silicon-on-insulator (SOI) Technology, manufacture and applications," points 10.7 and 10.8, by Oleg Kononchuk and Bich-Yen Nguyen, from Woodhead Publishing.

Nevertheless, these substrates fail to fulfil the most stringent specifications; for example, when localized heating beyond approximately 80° C. occurs, the resistivity of these substrates declines due to generation of heat carriers in the substrate and device/substrate coupling once again becomes a major contributor to attenuation and distortion of the signal and interference among components. Deteriorations in performance are also observed when the temperature falls to below 0° C.

BRIEF SUMMARY

The objective of the disclosure, therefore, consists in providing a suitable structure for radiofrequency applications, solving the drawbacks of the prior art. The objective of the disclosure is to provide an integrated structure delivering radiofrequency performances, particularly within the range of temperatures of use.

In accordance with embodiments of the present disclosure, a structure for radiofrequency applications includes:
 a semiconducting supporting substrate; and
 a trapping layer arranged on the supporting substrate.

According to the disclosure, the trapping layer comprises a defect density greater than a predetermined defect density. The predetermined defect density is the defect density for which the electrical resistivity of the trapping layer is greater than or equal to 10,000 ohm·cm over a temperature range extending from −20° C. to 120° C.

The structure for radiofrequency applications according to the disclosure, therefore, displays temperature-stable electrical properties, ensuring good stability and repeatability of the RF performances within the range of temperatures of use.

According to advantageous characteristics of the disclosure, either taken separately or in combination:
 the trapping layer has a resistivity at 20° C. greater than 10,000 ohm·cm and preferably greater than 50,000 ohm·cm;
 the difference in the thermal expansion coefficient between the trapping layer and the supporting substrate is less than 5 ppm/K between 100° C. and 1200° C.;
 the trapping layer comprises microstructures of a size smaller than 20 nm and preferably smaller than 10 nm;
 the trapping layer comprises a porous or polycrystalline material;
 the trapping layer comprises polycrystalline silicon containing 1% to 20% of carbon;
 the thickness of the trapping layer is between 10 μm and 50 μm and preferably between 20 μm and 30 μm;

the supporting substrate comprises at least one of the materials selected from the following group: silicon, silicon germanium and silicon carbide; and/or the resistivity of the supporting substrate is between 10 ohm·cm and 2,000 ohm·cm.

According to other advantageous characteristics of the disclosure, taken either separately or in combination:

an active layer is arranged on the trapping layer;

the active layer is transferred to the trapping layer by direct bonding;

the active layer is formed from a semiconducting material;

the active layer is formed from a piezoelectric material;

the thickness of the active layer is included between 10 μm and 50 μm;

a dielectric layer is arranged between the trapping layer and the active layer;

the dielectric layer is transferred to the trapping layer by direct bonding; and/or the dielectric layer is between 10 nm and 6 μm.

According to other advantageous characteristics of the disclosure, taken alone or in combination, at least one microelectronic device is present on or in the active layer:

the microelectronic device is a switching circuit or an antenna adaptation circuit or even a radiofrequency amplification circuit;

the microelectronic device comprises a plurality of active components and a plurality of passive components;

the microelectronic device comprises at least one control element and one MEMS switching element consisting of an ohmic-contact microswitch and a capacitive microswitch; and/or the microelectronic device is a radiofrequency filter operating by volume or surface sound wave propagation.

BRIEF DESCRIPTION OF THE DRAWINGS

Further characteristics and advantages of the disclosure will be clear from the following detailed description, made in reference to the appended figures, in which.

DETAILED DESCRIPTION

Figure 1:
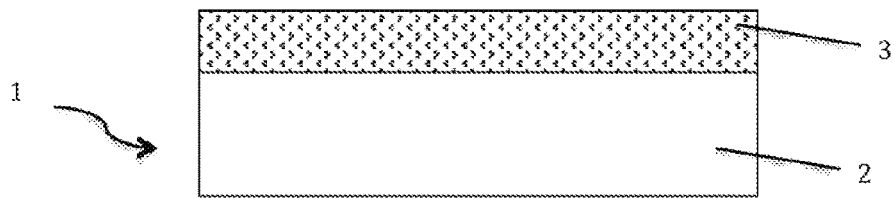
FIG. 1 represents a structure for radiofrequency applications according to the disclosure, comprising a substrate and a trapping layer.

The structure 1, 1', 11 for radiofrequency applications according to the disclosure comprises a semiconducting supporting substrate 2. The supporting substrate 2 may be made of materials commonly used in the microelectronic, optical, optoelectronic and photovoltaic industry. In particular, the supporting substrate 2 may comprise at least one material selected from the following group: silicon, silicon germanium, silicon carbide, etc. The resistivity of the supporting substrate may be between 1 ohm·cm and 10,000 ohm·cm; it is advantageously between 10 ohm·cm and 2,000 ohm·cm.

The structure 1, 1', 11 for radiofrequency applications also comprises a trapping layer 3 arranged on the supporting substrate 2, as illustrated in FIGS. 1, 3a, 3b, 4a, and 4b. The trapping layer 3 comprises a defect density greater than a predetermined defect density; the predetermined defect density is the defect density for which the electrical resistivity of the trapping layer is greater than or equal to 10,000 ohm·cm over the temperature range extending from −20° C. to 120° C.

The number of defects or the defect density may be determined using different methods, such as transmission electron microscopy (TEM). The defect density thus being known, the electrical resistivity of the trapping layer 3 can be measured at different temperatures. By way of example, the predetermined defect density may be between $10^{19}$ and $10^{21}$ cm$^{-3}$ (for example, in the case of a trapping layer made of polycrystalline silicon).

In the case of an adequate defect density in the trapping layer 3 (the predetermined defect density according to the disclosure) correlated with a high resistivity, the conductivity mechanism in the trapping layer 3 is dominated by a hopping conductivity regime. This makes it possible to maintain a resistivity level above the threshold of 10,000 ohm·cm, within the temperature range extending from −20° C. to 120° C. The person skilled in the art will encounter a presentation of hopping electrical conductivity in the article by N. F. Mott in *Phil. Mag.* 19:835 (1969).

"Defect," without wishing to be restrictive, means grain boundaries in polycrystalline materials, empty areas in porous materials, gaps, inclusions, etc.

Advantageously, the trapping layer 3 comprises microstructures of a size smaller than 20 nm; preferably, the microstructures have a size smaller than 10 nm. "Microstructures" mean crystallites, particularly for polycrystalline materials, also referred to as "grains."

Thus, the smaller the microstructures in the trapping layer 3, the greater the defect density in the latter may be.

Advantageously, the trapping layer 3 also has a resistivity greater than 10,000 ohm·cm, at ambient temperature. Preferably, the trapping layer 3 has a resistivity of more than 50,000 ohm·cm.

The aforementioned physical characteristics (microstructure) and electrical characteristics (resistivity) of the trapping layer 3 guarantee a hopping conductivity mechanism in the latter, displaying a low level of temperature dependence; the resistivity of the trapping layer 3 likewise displays low temperature dependence compared with state of the art layers, maintaining a level of more than 10,000 ohm·cm over the entire intended temperature range.

The thickness of the trapping layer 3 may be between 10 μm and 50 μm; preferably, it is between 20 μm and 30 μm. The thickness of the trapping layer 3 is such that the RF signals originating from the components manufactured on the structure 1, 1' penetrate and are propagated predominately in the trapping layer 3, without reaching the underlying supporting substrate 2. The electrical properties of the supporting substrate 2 and trapping layer 3 assembly are thus essentially dictated by the properties of the trapping layer 3. Consequently, there are fewer requirements imposed on the resistivity of the supporting substrate 2. In the case of silicon substrates, the cost and availability of substrates with a resistivity within the range of 10 ohm·cm and 1000 ohm·cm are more favorable than those of substrates with a very high resistivity (greater than 1,000 ohm·cm and up to 20,000 ohm·cm).

The trapping layer 3 also has a small difference in thermal expansion coefficient in relation to the supporting substrate 2 between 100° C. and 1200° C. and advantageously less than 5 ppm/K. Indeed, subsequent manufacture of RF components on top of the trapping layer 3 generally requires heat treatment stages at temperatures exceeding 850° C., or even exceeding 1100° C., for example, 1200° C. At such temperatures and for thicknesses of the trapping layer 3 on the order of a few tens of microns, an excessive difference in thermal expansion coefficient between the trapping layer 3 and the supporting substrate 2 may cause deformations that are incompatible with subsequent manufacturing processes or even liable to break the substrate. A difference in thermal expansion coefficient between the trapping layer 3 and the supporting substrate 2 of less than 5 ppm/K avoids the risk of breakage of the structure.

The trapping layer 3 advantageously consists of porous or polycrystalline material. According to a first, non-restrictive example, the supporting substrate 2 is a silicon substrate and the trapping layer 3 is a porous silicon layer comprising microstructures of a size smaller than 20 nm, having a porosity greater than 50% and a thickness of 30 µm. Formation of the porous silicon layer advantageously comprises the following stages:
  formation of a layer of p-doped silicon (boron, for example) by epitaxy on the supporting substrate, wherein the formation is performed by means of a vapor deposition method, at a temperature ranging between 900° C. and 1200° C., with trichlorosiliane and diborane ($B_2H_6$) as precursors;
  subsequently, electrochemical anodizing.

The size of the microstructures gives the trapping layer 3 a resistivity of more than 10,000 ohm·cm, stable over the entire temperature range extending from −20° C. to 120° C. The pores of the trapping layer 3 are not affected during a high temperature heat treatment stage (typically up to 1100° C.). Since the size of the grains in the trapping layer 3 governs the resistivity of trapping layer 3, its electrical properties remain unchanged after heat treatments for production of the components.

According to a second, non-restrictive example, the supporting substrate 2 is a silicon substrate and the trapping layer 3 is a polycrystalline silicon layer comprising grains of a size smaller than 20 nm, preferably smaller than 10 nm and having a thickness of between 10 µm and 50 µm, for example, 30 µm. The difference in thermal expansion coefficient between the supporting substrate 2 and the trapping layer 3 is less than 5 ppm/K and prevents any excessive deformation of the substrate capable of causing its breakage. The trapping layer 3 furthermore has a resistivity of more than 50,000 Ohm·cm at ambient temperature.

In order to allow the trapping layer 3 to maintain its physical characteristics (microstructures) following application of high-temperature heat treatments (required for subsequent manufacture of RF components), the polycrystalline silicon layer advantageously includes carbon at a content of between 1% and 20%, for example 5%. Creation of such a trapping layer 3 requires use of vapor-phase chemical deposition methods. The layer formation temperature must, in this case, be greater than 700° C., preferably greater than 900° C. and even more preferentially between 1100° C. and 1200° C. The carbon (C) precursors may comprise at least one of the elements selected from among methylsilane ($SiH_3CH_3$), methane ($CH_4$), ethane ($C_2H_6$), propane ($C_3H_8$), butane ($C_4H_{10}$), and methyltrichlorosilane ($SiCH_3C_{13}$). The Silicon (Si) precursors may comprise at least one of the elements selected from among silane ($SiH_4$), disilane ($Si_2H_6$), dichlorosilane ($SiH_2C_{12}$), trichlorosilane ($SiHC_{13}$), and tetrachlorosilane ($SiC_{14}$).

Carbon doping of the polysilicon layer allows stabilization of the grain size during thermal annealing comprising a temperature increase greater than 850° C., for example, 1200° C. Indeed, without this carbon doping, the grains of the polysilicon trapping layer 3 are reorganized and undergo an increase in size, resulting in a drastic reduction in the resistivity of the trapping layer 3 and deterioration in its electrical characteristics.

When carbon doping is introduced into the polysilicon trapping layer 3, the carbon atoms are concentrated at the grain boundaries and freeze any reorganization of the grains during thermal annealing comprising a temperature increase of more than 850° C. Consequently, the thermal treatment stages for production of the components do not affect the physical and electrical properties of the trapping layer 3.

Figure 2:
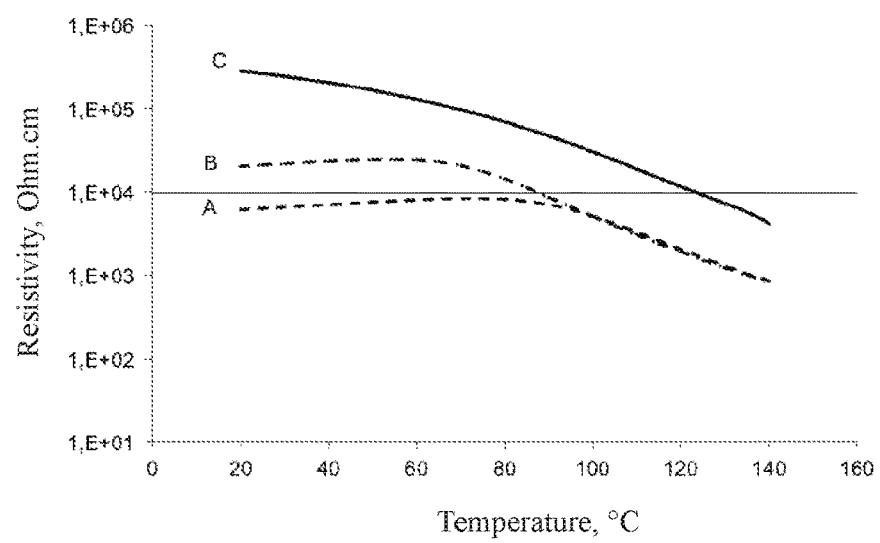
FIG. 2 shows comparative curves of the resistivity of structures according to the state of the art and a structure according to the disclosure.

FIG. 2 illustrates the resistivity of the trapping layer 3 according to the disclosure (curve C) simulated over the temperature range extending from 20° C. to 140° C. It will be noted that the resistivity of layer 3 is greater than 10,000 ohm·cm, at least up to 120° C., corresponding to the upper bound of the intended temperature range. In comparison, the simulated resistivity of state of the art structures (curves A and B) show values much lower than 10,000 ohm·cm at 120° C., which does not allow RF performances sufficient to fulfil the stringent specifications of the LTE (Long Term Evolution) standards of mobile telephony. A structure 1, 1', 11 for RF applications according to the disclosure will, for its part, guarantee a stable performance that is insensitive to temperature variations within the range of use.

According to a first embodiment of the disclosure, the structure 1 for radiofrequency applications may adopt the form of a wafer with dimensions compatible with microelectronic processes, for example, of a diameter of 200 mm or 300 mm, comprising the supporting substrate 2 and the trapping layer 3. The latter may be produced according to the first or second example mentioned above, though these manufacturing examples are nevertheless not exhaustive.

Figure 3A:
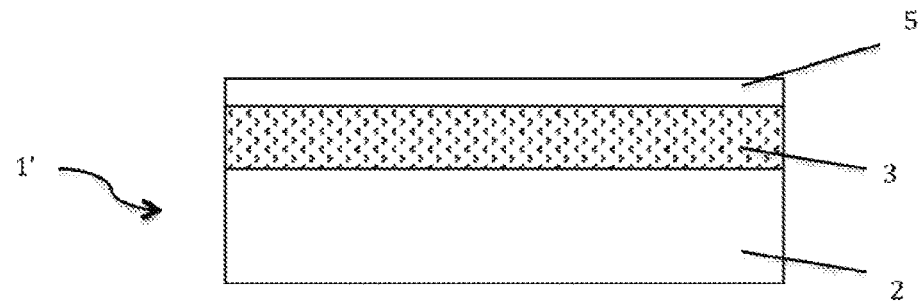
FIGS. 3a and 3b respectively represent a structure for radiofrequency applications according to the disclosure, furthermore comprising an active layer.

According to a second embodiment of the disclosure illustrated in FIG. 3a, the structure for radiofrequency applications may adopt the form of a wafer and furthermore comprise an active layer 5, arranged on the trapping layer 3, in and on which it will be possible to produce RF components. The active layer 5 may advantageously consist of semiconductive materials and/or piezoelectric materials. Advantageously, without being restrictive, however, the active layer 5 comprises at least one of the materials from among silicon, silicon carbide, silicon germanium, lithium nobiate, lithium tantalate, quartz and aluminum nitride. The thickness of the active layer 5 may vary between a few nanometers (10 nm, for example) and several tens of microns (50 µm, for example) according to the components to be manufactured.

By way of example, the active layer 5 is transferred to a supporting substrate 2 comprising the trapping layer 3, using one of the methods of transferring thin layers well known to the person skilled in the art, wherein:
  the SMART CUT® method, based on an implantation of light ions of hydrogen and/or helium in a donor substrate and bonding, for example, by molecular adhesion of this donor substrate to the trapping layer 3, arranged in turn on the supporting substrate 2; a detachment stage subsequently allows separation of a superficial fine layer of the donor substrate (the active layer), at the level of the fragilization plane defined by the ion implantation depth. Finishing stages that may include high temperature heat treatments finally give the active layer 5 the required crystalline and surface quality. This method is particularly suitable for manufacturing thin active layers between a few nanometers and approximately 1.5 μm thick for silicon layers, for example.

the SMART CUT® method followed by an epitaxy stage, making it possible, in particular, to obtain thicker active layers, for example, between a few tens of nanometers and 20 μm thick.

direct bonding, as well as mechanical, chemical and/or chemical-mechanical methods, involve assembling a donor substrate by molecular adhesion on the trapping layer 3, arranged in turn on the supporting substrate 2 and subsequently thinning the donor substrate down to the desired active layer thickness by grinding, for example, and by CMP (chemical-mechanical polishing). These methods are particularly suitable for transferring thick layers, between a few microns and several tens of microns, for example, and up to a few hundreds of microns.

Figure 3B:
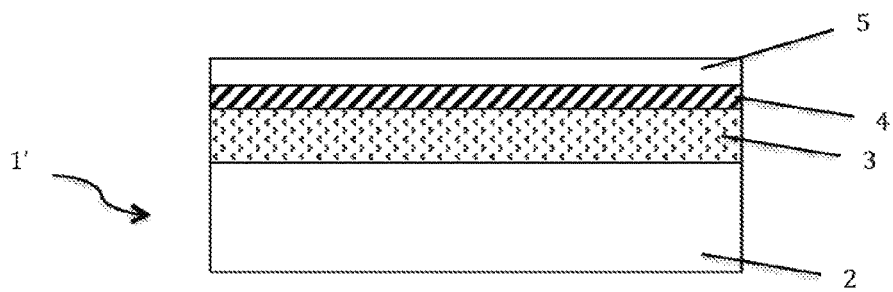

According to a variant of the second embodiment, illustrated in FIG. 3b, the structure 1' for radiofrequency applications may also comprise a dielectric layer 4, arranged between the active layer 5 and the trapping layer 3. Advantageously, without its being restrictive however, the dielectric layer 4 will comprise at least one of the materials from among silicon dioxide, silicon nitride and aluminum oxide. Its thickness may vary between 10 nm and 6 μm.

The dielectric layer 4 is obtained by thermal oxidation or by deposition using LPCVD or PECVF or HPD on the trapping layer 3 or on the donor substrate prior to transferring the active layer 5 to the trapping layer 3.

Figure 4A:
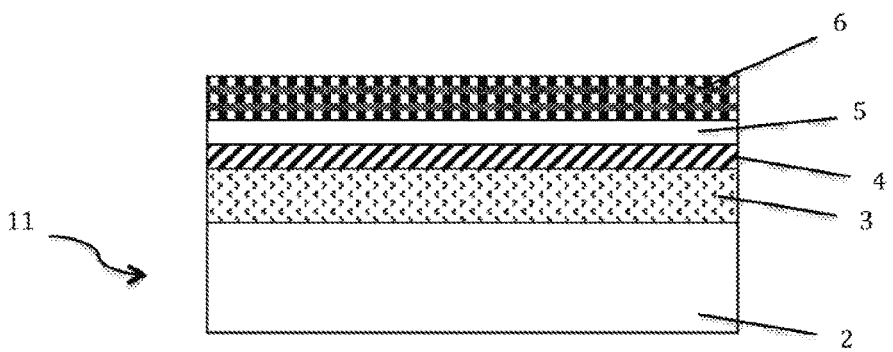
FIGS. 4a and 4b respectively represent a structure for radiofrequency applications according to the disclosure furthermore comprising a microelectronic device.

According to a third embodiment, illustrated in FIG. 4a, the structure 11 for radiofrequency applications may also comprise or consist of a microelectronic device 6 on or in the active layer 5, wherein the latter is arranged on a dielectric layer 4 or directly on the trapping layer 3. The microelectronic device 6 may be a switching circuit, an adaptation or tuner circuit or even a power amplifier circuit, produced using silicon microelectronics technologies. The silicon active layer 5 typically has a thickness of between 50 nm and 180 nm, for example, 145 nm and the underlying dielectric layer 4 has a thickness of between 50 nm and 400 nm, for example, 200 nm; the trapping layer 3 is arranged between the dielectric layer 4 and the supporting substrate 2. The microelectronic device 6 produced in and on the active layer 5 comprises a plurality of active components (of the MOS, bipolar type, etc.) and a plurality of passive components (of the capacitance, inductance, resistor, resonator and filter type, etc.). Manufacture of the microelectronic components requires carrying out several stages including heat treatments at high temperatures, typically at 950° C.-1100° C. or higher. The trapping layers 3 described in the first and second examples previously mentioned retain their physical and electrical properties after such heat treatments.

Figure 4B:
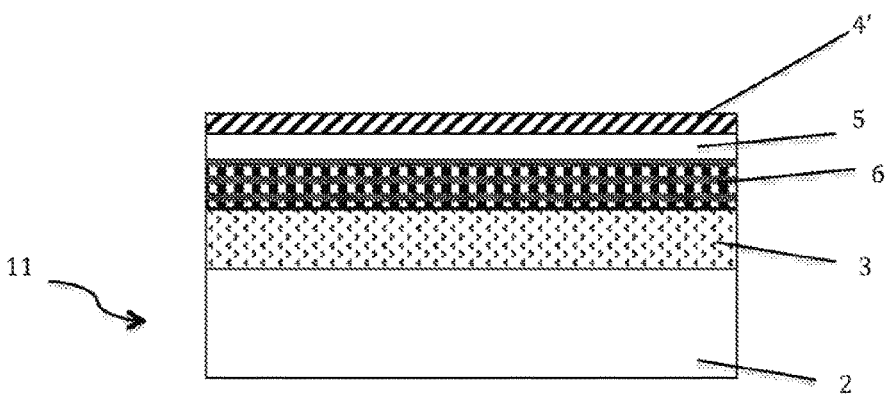

In a variant of this embodiment, the microelectronic device 6 can be initially produced on an SOI (silicon-on-insulator)-type substrate and subsequently transferred using a layer transfer method known to a person skilled in the art to a structure 1 according to the invention comprising a trapping layer 3 arranged on the supporting substrate 2. In this case, as illustrated in FIG. 4b, the structure 11 comprises a supporting substrate 2 on which the trapping layer 3 is arranged. The layer of components of the microelectronic device 6 appears on top of the latter. The so-called "back end" of metallic interconnection layers and of dielectrics is arranged on top of the trapping layer 3, with the so-called "front end" (silicon), partly produced in the active layer, being itself on top of the "back end" part. Finally, the active layer 5 and optionally a dielectric layer 4' is furthermore located on top.

In both sets of circumstances, the electromagnetic fields, derived from the high frequency signals intended to be propagated in the devices 6 and which will penetrate into the trapping layer 3, will only suffer minor losses (insertion losses) and interferences (diaphony, harmonics) owing to the resistivity greater than 10,000 ohm·cm of the trapping layer 3 and moreover throughout the entire range of temperature of use between −20° C. and 120° C.

According to a fourth embodiment, the structure 11 for radiofrequency applications may comprise or consist of a microelectronic device 6 featuring at least one control element and a MEMS (microelectromechanical system) switching element consisting of an ohmic-contact microswitch and a capacitive microswitch.

Manufacture of the MEMS can be facilitated by the presence of a dielectric layer 4 under an active layer 5 of silicon. The structure 11, according to the disclosure, may therefore comprise, by way of example, an active layer 5 made of silicon of a thickness of between 20 nm and 2,000 nm, advantageously 145 nm, in addition to an underlying dielectric layer 4 of a thickness of between 20 nm and 1,000 nm, advantageously 400 nm; the trapping layer 3 is arranged between the dielectric layer 4 and the supporting substrate 2. Manufacture of the MEMS part is subsequently based on surface micromachining methods, permitting, in particular, release of beams or movable membranes in the active layer 5 of silicon.

Alternatively, and as well known to persons skilled in the art, the MEMS part can be produced directly on the trapping layer 3 by successive deposition of a plurality of layers (including an electrode, a dielectric, a sacrificial layer and an active layer) and by creating motifs on these different layers.

The microelectronic methods used to manufacture the control element(s) (CMOS, for example), usually performed before the MEMS part, require, as in the previous embodiment, application of heat treatments at high temperatures. The fact that the trapping layer 3 according to the disclosure does not undergo any physical and electrical changes during this type of treatment is highly advantageous.

In the same manner as for the third embodiment, the high frequency signals that are propagated in this device generate electromagnetic fields that penetrate into the trapping layer 3. The losses (insertion losses), distortions (harmonics) and other interferences (diaphony, etc.) will be less owing to the higher resistivity at 10,000 ohm·cm of the trapping layer 3 throughout the entire intended temperature range for use of the device 6.

According to a fifth embodiment, the structure 11 for radiofrequency applications may comprise or consist of a microelectronic device 6 featuring a radiofrequency filter operating by volume sound wave propagation (referred to as "BAW" (Bulk Acoustic Wave)).

Manufacture of a BAW filter of the FBAR (thin-Film Bulk Acoustic Resonator) type requires an active layer 5 formed of a piezoelectric material, in which the sound wave will be confined, between the two surrounding electrodes. The structure 11 according to the disclosure may, therefore, comprise, by way of example, an active layer 5 made of aluminum nitride of a thickness of between 50 nm and 1 μm, advantageously 100 nm, in addition to a dielectric layer 4 (for example, consisting of silicon oxide) the thickness of which is between 1 μm and 6 μm. The trapping layer 3 is arranged between the dielectric layer 4 and the supporting substrate 2. Insulating cavities are arranged under the active areas of the filter, i.e., the areas in which the sound waves will propagate.

Manufacture of the BAW filter furthermore requires stages involving depositing electrodes to which the RF signal will be applied.

The structure according to the disclosure makes it possible on the one hand to restrict the depth of the insulating cavities, the insulating function of which in relation to the substrate is rendered less critical by the resistivity greater than 10,000 ohm·cm of the trapping layer 3, throughout the entire intended temperature range. This is an advantage in terms of simplification, flexibility and robustness of the manufacturing process of these devices. Furthermore, the structure 11 according to the disclosure makes it possible to obtain better performances of the filters throughout the entire intended temperature range for use of the device 6, particularly in terms of linearity.

In a variant of this fifth embodiment, the microelectronic device 6 comprises a radiofrequency filter operating by surface sound wave propagation (referred to as "SAW" (Surface Acoustic Wave)).

Manufacture of an SAW filter requires an active layer 5 formed of a piezoelectric material, on the surface of which a comb-like array of electrodes will be produced; the sound wave is intended to propagate between these electrodes. The structure 11 according to the disclosure may, therefore, comprise, by way of example, an active layer 5 made of lithium tantalate of a thickness of between 200 nm and 20 µm, advantageously 0.6 µm; the trapping layer 3 is arranged between the active layer 5 and the supporting substrate 2. A dielectric layer 4 may optionally be added between the active layer 5 and the trapping layer 3.

The structure 11 according to the disclosure makes it possible to obtain better filter performances throughout the entire intended temperature range for use of the device 6, particularly in terms of insertion losses and linearity.

The structures 1, 1', 11 for radiofrequency applications according to the disclosure are not limited to the embodiments mentioned above. They are suitable for any application in which high frequency signals propagate and are liable to undergo undesirable losses or interferences in a supporting substrate 2, since the physical and electrical characteristics of the trapping layer 3 arranged on the supporting substrate 2 give the structure 1, 1', 11 good RF properties (restricting losses, non-linearities and other interferences), stable within a range of temperatures of use, i.e., between −20° C. and 120° C.

The invention claimed is:

1. A structure for radiofrequency applications, comprising:
   a semiconducting supporting substrate; and
   a trapping layer arranged on the supporting substrate, the trapping layer comprising polycrystalline silicon including 1% to 20% of carbon;
   wherein the trapping layer comprises a defect density greater than a predetermined defect density, the predetermined defect density being the defect density for which the electrical resistivity of the trapping layer is greater than or equal to 10,000 ohm·cm over a temperature range extending from −20° C. to 120° C.

2. The structure for radiofrequency applications according to claim 1, wherein the trapping layer has a resistivity, at 20° C., of greater than 10,000 ohm·cm.

3. The structure for radiofrequency applications according to claim 2, wherein the trapping layer has a resistivity, at 20° C., of greater than 50,000 ohm·cm.

4. The structure for radiofrequency applications according to claim 1, wherein a difference in thermal expansion coefficient between the trapping layer and the supporting substrate is less than 5 ppm/K between 100° C. and 1200° C.

5. The structure for radiofrequency applications according to claim 1, wherein the trapping layer comprises microstructures of a size smaller than 20 nm.

6. The structure for radiofrequency applications according to claim 1, wherein the trapping layer comprises a porous or polycrystalline material.

7. The structure for radiofrequency applications according to claim 1, wherein a thickness of the trapping layer is between 10 µm and 50 µm.

8. The structure for radiofrequency applications according to claim 1, wherein the supporting substrate comprises at least one material selected from the group consisting of: silicon, silicon germanium, and silicon carbide.

9. The structure for radiofrequency applications according to claim 1, wherein a resistivity of the supporting substrate is between 10 ohm·cm and 2000 ohm·cm.

10. The structure for radiofrequency applications according to claim 1, wherein an active layer is disposed on the trapping layer.

11. The structure for radiofrequency applications according to claim 10, wherein the active layer comprises a semiconductor material.

12. The structure for radiofrequency applications according to claim 10, wherein the active layer comprises a piezoelectric material.

13. The structure for radiofrequency applications according to claim 10, wherein a thickness of the active layer is between 10 µm and 50 µm.

14. The structure for radiofrequency applications according to claim 10, wherein a dielectric layer is disposed between the trapping layer and the active layer.

15. The structure for radiofrequency applications according to claim 14, wherein the dielectric layer has a thickness between 10 nm and 6 µm.

16. The structure for radiofrequency applications according to claim 10, further comprising at least one microelectronic device on or in the active layer, wherein the at least one microelectronic device comprises a switching circuit, an antenna adaptation circuit, or a radiofrequency power amplification circuit.

17. The structure for radiofrequency applications according to claim 10, further comprising at least one microelectronic device on or in the active layer, wherein the at least one microelectronic device comprises a plurality of active components and a plurality of passive components.

18. The structure for radiofrequency applications according to claim 10, further comprising at least one microelectronic device on or in the active layer, wherein the at least one microelectronic device comprises at least one control element and one MEMS switching element comprising an ohmic-contact microswitch or a capacitive microswitch.

19. The structure for radiofrequency applications according to claim 10, further comprising at least one microelectronic device on or in the active layer, wherein the at least one microelectronic device comprises a radiofrequency filter operating by volume or surface sound wave propagation.

\* \* \* \* \*